United States Patent [19]
He

[11] Patent Number: 6,128,636
[45] Date of Patent: Oct. 3, 2000

[54] METHOD FOR INTERFACING FLOATING POINT AND INTEGER PROCESSES IN A COMPUTER SYSTEM

[75] Inventor: Liang He, Sunnyvale, Calif.

[73] Assignee: Sun Microsystems, Inc., Palo Alto, Calif.

[21] Appl. No.: 09/021,969

[22] Filed: Feb. 11, 1998

[51] Int. Cl.⁷ ..................................................... G06F 7/00
[52] U.S. Cl. ............................................................. 708/204
[58] Field of Search .................................. 708/204, 495; 712/222; 341/75

[56] References Cited

U.S. PATENT DOCUMENTS

| | | |
|---|---|---|
| 4,038,538 | 7/1977 | Semmelhaack et al. ................... 341/75 |
| 5,257,215 | 10/1993 | Poon ......................................... 708/204 |
| 5,561,615 | 10/1996 | Kuo et al. ................................. 708/204 |
| 5,764,548 | 6/1998 | Keith et al. ............................... 708/204 |

*Primary Examiner*—Ohuong Dinh Ngo
*Attorney, Agent, or Firm*—Sierra Patent Group, Ltd.

[57] ABSTRACT

According to a presently preferred embodiment of the present invention, a method for interfacing a floating point-based process with an integer-based process is described, the method having the steps of providing a floating point process, providing an integer process, initiating a transfer of data from said floating point process to said integer-based process, the transfer having the steps of selecting a memory location containing a floating point value to be handed off to the integer-based process, determining whether the memory location contains a positive number or a negative number, computing the absolute value of the value in the memory location, adding a magnitude of 0.5 to the absolute value, multiplying, if the result of the determining step was negative, the results of the adding step by −1, and converting the results of the multiplying step to integer form.

10 Claims, 3 Drawing Sheets

METHOD FOR INTERFACING FLOATING POINT AND INTEGER PROCESSES IN A COMPUTER SYSTEM

BACKGROUND OF THE INVENTION

1. Field of the Invention

The present invention relates to a method for interfacing floating point and integer processes in a computer system.

2. The Background Art

In modern computer systems, data may be represented in many ways, depending on the requirements of the process using the data. For example, there are several types of integer formats, two types of floating point formats (float and double), and boolean and character formats.

Integers are typically designated byte, short, int and long, representing 8, 16, 32, and 64 bit integers respectively. Although these terms are standard, other definitions may be assigned to these terms depending on what size the standard word size is on any given computer system.

Positive integer values are represented as the straight base 2 equivalent of the base 10 number. A negative number, instead of being represented by same magnitude with the sign bit set, is represented, in two's complement notation, as the binary number to which a positive number of the same magnitude is added to get zero. The two's complement of a number is found by "complementing" each binary digit (changing ones to zeros and zeros to ones) and then adding "1".

FIG. 1 is a diagram depicting the typical arrangement of a 32-bit integer in memory.

Referring to FIG. 1, a typical 32-bit integer value is represented as a sign bit 10, and a group of magnitude bits 12.

FIG. 2 is a diagram depicting the typical arrangement of a 32-bit floating point number in memory.

Referring to FIG. 2, a typical 32-bit floating point value is represented as a sign bit 14, exponent bits 16, and fractional bits 18.

With respect to floating point numbers, the term "float" typically refers to a 32-bit single precision number, and "double" refers to a 64-bit double precision number. However, 32-bit and 64-bit non-integer numbers are both generally classified as floating point numbers and will be referred to as such for the purposes of this disclosure. It is not the number of bits used when representing a number, or the way that number is described in memory, that classifies it as floating point. Rather, for the purposes of this disclosure, the term floating point will apply to any positive or negative real number.

In a normal computing session, it is common to have many different processes operating on data, occasionally swapping the data between those processes. In order to swap data between processes, the originating process must format the data in a way that is known by the receiving process. Thus, a floating point process which passes data to an integer process must convert the floating point data to integer format prior to passing the data.

Algorithms known in the art which interface floating point processes with integer-based processes, while useful for their intended purpose, often round a floating point number down to the next lower integer value, rather than rounding to the nearest integer. By rounding to the next lower integer rather than the nearest integer, the accuracy of the operation is reduced. It would therefore be beneficial to provide a method for interfacing a floating point-based process with an integer-based process which provides accurate conversion of the data between the two processes.

OBJECTS AND ADVANTAGES OF THE INVENTION

An object and advantage of the present invention is to provide a method for interfacing a floating point process with an integer process which provides accurate conversion of the data between the two processes.

This and many other objects and advantages of the present invention will become apparent to those of ordinary skill in the art from a consideration of the drawings and ensuing description of the invention.

SUMMARY OF THE INVENTION

According to a presently preferred embodiment of the present invention, a method for interfacing a floating point-based process with an integer-based process is described, the method having the steps of providing a floating point process, providing an integer process, initiating a transfer of data from said floating point process to said integer-based process, the transfer having the steps of selecting a memory location containing a floating point value to be handed off to the integer-based process, determining whether the memory location contains a positive number or a negative number, computing the absolute value of the value in the memory location, adding a magnitude of 0.5 to the absolute value, multiplying, if the result of the determining step was negative, the results of the adding step by −1, and converting the results of the multiplying step to integer form.

DESCRIPTION OF A PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Figure 3:
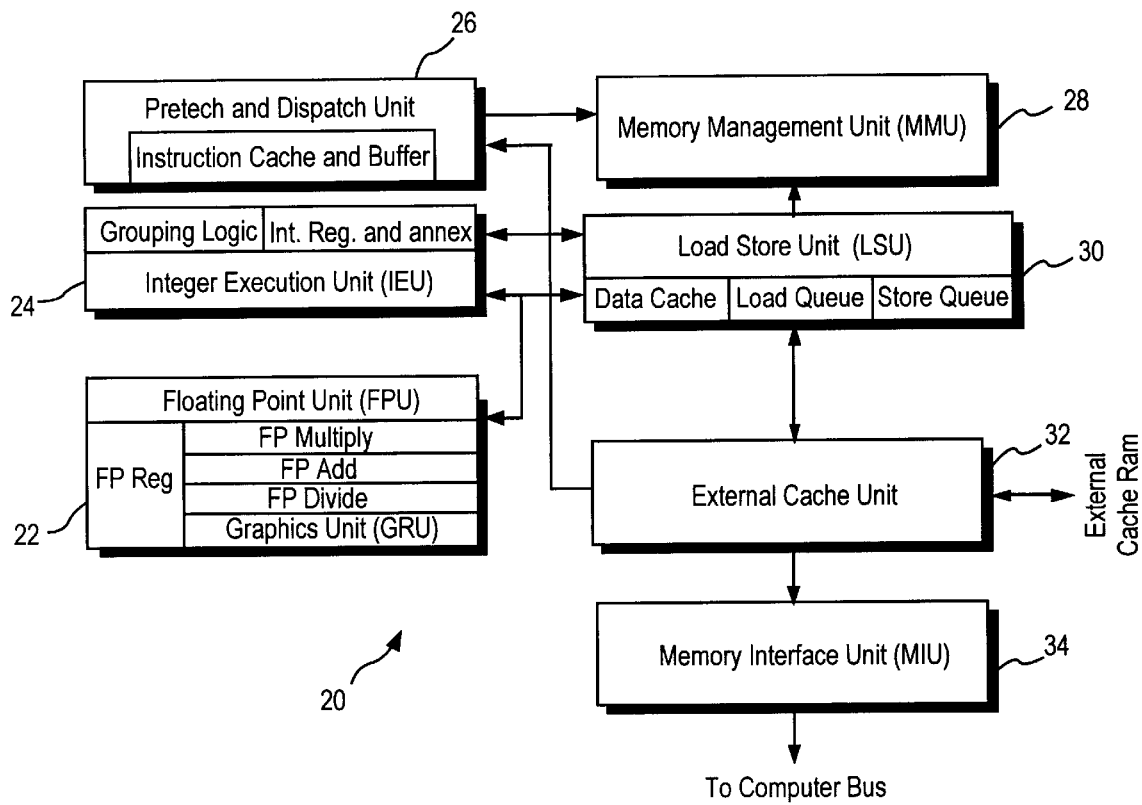
FIG. 3 is a block diagram of a representative Central Processing Unit utilizing the present invention.
Figure 4:
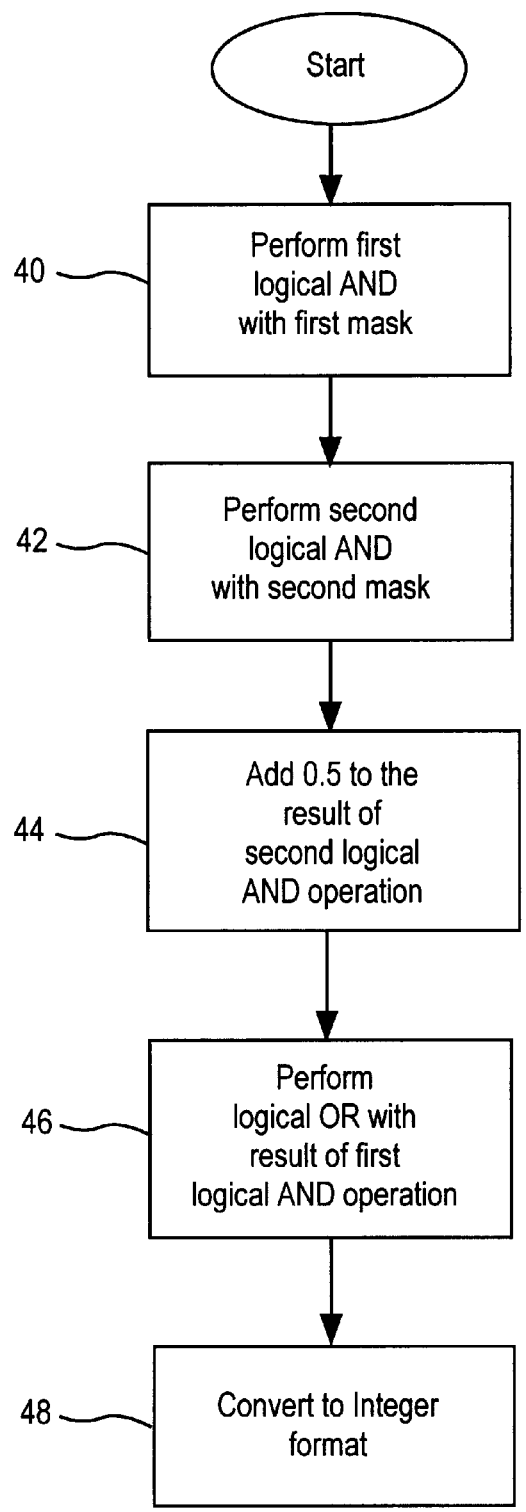
FIG. 4 is a flow chart depicting steps in a method of a presently preferred embodiment of the present invention.

FIG. 3 is a block diagram of a representative Central Processing Unit utilizing the present invention.

Referring to FIG. 3, a Central Processing Unit (CPU) 20 is presented which comprises a Floating Point Unit 22, an Integer Execution Unit 24, a Prefetch and Dispatch Unit 26, a Memory Management Unit 28, a Load Store Unit 30, an External Cache Unit 32, and a Memory Interface Unit 34.

In the processor 20 utilized in a presently preferred embodiment, logical operations required in a preferred embodiment the method of the present invention are able to be performed both in Integer Execution Unit 24 and in Floating Point Unit 22. Both of these subsections of processor 20 contain specialized instruction sets for performing individual logical operations as required.

Those of ordinary skill in the art will readily recognize that the construction of logic circuits performing logical AND and OR operations, and addition operations are well known in the art. These construction details known in the art are not described herein in order to avoid overcomplicating the disclosure.

Those of ordinary skill in the art will also readily recognize that the processor described herein, although typical, is only representative. Other processors may be constructed differently but function adequately when performing steps in the method of the present invention.

FIG. 3 is a flow chart depicting steps in the method of a presently preferred embodiment of the present invention.

Figure 1:
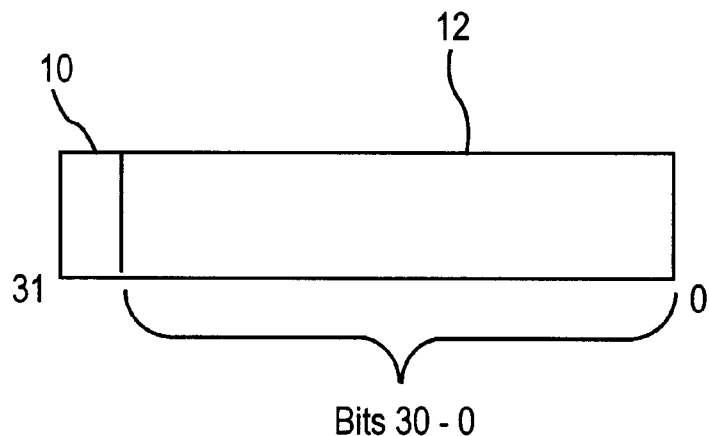
FIG. 1 is a diagram depicting the typical arrangement of a 32-bit integer in memory.
Figure 2:
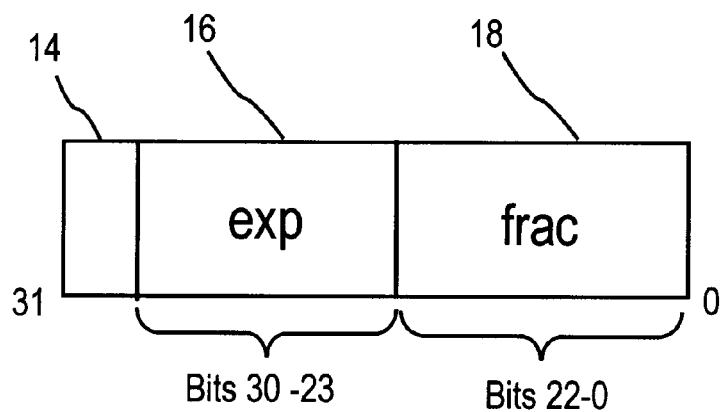
FIG. 2 is a diagram depicting the typical arrangement of a 32-bit floating point number in memory.

Referring to FIG. 3, at step 40, a floating point number to be passed to an integer process is logically AND'd with a first mask in order to isolate the sign bit. Using the 32-bit floating point representation seen previously in FIG. 2, the mask would comprise 0x80000000 hexadecimal. The results of this operation are stored temporarily for later use.

Those of ordinary skill in the art will readily recognize that the mask used in step 40 depends upon how many data bits make up the floating point number being converted. For example, a method converting a 16-bit floating point number will use a mask of 0x8000. Correspondingly, when converting a 64-bit or 128-bit value, masks comprise 0x8000000000000000 (8, followed by 15 zeros) hexadecimal or 0x80000000000000000000000000000000 (8, followed by 31 zeros) hexadecimal respectively. Other numbers of bits which represent the floating point value may be accommodated so long as the mask has a "1" in the most significant bit (MSB), "0" in every bit other than the MSB, and the mask comprises the same number of bits as the floating point number being converted.

At step 42, the same floating point number to be passed to an integer process is logically AND'd with a second mask. The result of this operation is the absolute value of the floating point number. Using the same 32-bit floating point representation seen previously in FIG. 2, the mask would comprise 0x7FFFFFFF hexadecimal. Other numbers of bits which represent the floating point value may be accommodated so long as the mask has a "0" in the most significant bit (MSB), "1" in every bit other than the MSB, and the mask comprises the same number of bits as the floating point number being converted. Those of ordinary skill in the art will readily recognize that the mask used in step 42 is the complement of the mask used in step 40.

At step 44, the result of the operation performed at step 42 is added to 0.5. This operation has the effect of eliminating any rounding errors which take place using the prior art methods used to convert floating point numbers to integer format.

At step 46, the result of the AND operation performed at step 40 is logically AND'd with the result of step 44, thus restoring the original sign bit.

At step 48, the result of step 46 is cast into an integer value using techniques known to those of ordinary skill in the art.

Those of ordinary skill in the art will readily recognize that prior art floating point to integer conversions often round a decimal value downward, regardless of the value of the fractional piece being rounded, causing an error of 0.99, or greater, depending on the number of digits in the fractional part of the base 10 representation of the number being converted. For example, converting the floating point value of 1.99 to an integer using prior art methods often results in an integer value of 1. However, the present invention accommodates the more desirable approach of having the floating point value of 1.99 round up to 2, the nearest integer.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. In a computer having a memory and facilities for running two processes, a method for interfacing a floating point-based process with an integer-based process comprising the steps of:

providing a floating point process;

providing an integer process; and initiating a transfer of data from said floating point process to said integer-based process, the transfer comprising the steps of selecting a memory location containing a floating point value to be handed off to the integer-based process, causing a first logical AND operation to be performed on the value of said memory location with a first mask, causing a second logical AND operation to be performed on the value of said memory location with a second mask, causing a first addition operation to be performed, said operation accomplishing the adding of the results of said second logical AND operation with a magnitude of 0.5, causing a first logical OR operation to be performed on said results of said first addition operation with said results of said first logical AND operation;

wherein said first and said second mask each comprise the same number of bits as said floating point value, all bits in said first mask are set low (e.g. to a "0") except for the most significant bit of said first mask which is set high (e.g. to a "1"), and all bits in said second mask are set high (e.g. to a "1") except for the most significant bit of said second mask which is set low (e.g. to a "0").

2. The method of claim 1 wherein:

said floating point value is represented in thirty-two consecutive memory bits.

3. The method of claim 1 wherein:

said floating point value is represented in sixteen consecutive memory bits.

4. The method of claim 1 wherein:

said floating point value is represented in sixty-four consecutive memory bits.

5. The method of claim 1 wherein:

said floating point value is represented in 128 consecutive memory bits.

6. A computer program for interfacing a floating point process with an integer-based process, the program recorded in a computer-readable medium, the program causing the processor to perform the steps of:

providing a floating point process;

providing an integer process; and initiating a transfer of data from said floating point process to said integer-based process, the transfer comprising the steps of selecting a memory location containing a floating point value to be handed off to the integer-based process, causing a first logical AND operation to be performed on the value of said memory location with a first mask, causing a second logical AND operation to be performed on the value of said memory location with a second mask, causing a first addition operation to be performed, said operation accomplishing the adding of the results of said second logical AND operation with a magnitude of 0.5, causing a first logical OR operation to be performed on said results of said first addition operation with said results of said first logical AND operation;

wherein said first and said second mask each comprise the same number of bits as said floating point value, all bits in said first mask are set low (e.g. to a "0") except for the most significant bit of said first mask which is set high (e.g. to a "1"), and all bits in said second mask are set high (e.g. to a "1") except for the most significant bit of said second mask which is set low (e.g. to a "0").

7. The method of claim 6 wherein:

said floating point value is represented in thirty-two bit consecutive memory bits.

8. The method of claim 6 wherein:

said floating point value is represented in sixteen-bit consecutive memory bits.

9. The method of claim 6 wherein:

said floating point value is represented in sixty-four consecutive memory bits.

10. The method of claim 6 wherein:

said floating point value is represented in 128 consecutive memory bits.

* * * * *